United States Patent [19]

Chandraiah et al.

[11] Patent Number: 5,317,480
[45] Date of Patent: May 31, 1994

[54] CIRCUIT PACK INTERCONNECTION

[75] Inventors: Vidyananda B. Chandraiah, Parsippany-Troy Hills Township, Morris County, N.J.; David J. Pongracz, Bangor, Pa.

[73] Assignee: AT&T Bell Laboratories, Murray Hill, N.J.

[21] Appl. No.: 930,051

[22] Filed: Aug. 21, 1992

[51] Int. Cl.⁵ .................. H01R 23/68; H01R 13/62
[52] U.S. Cl. ........................... 361/785; 361/760; 439/53; 439/64; 439/376
[58] Field of Search ............ 361/395, 397, 398, 399, 361/400, 401, 412, 413, 414, 415; 439/43, 53, 55, 59, 60, 62, 64, 78, 79, 80, 81, 374, 376, 377, 629, 630, 636, 668, 682; 211/41

[56] References Cited

U.S. PATENT DOCUMENTS

| | | | |
|---|---|---|---|
| 4,614,389 | 9/1986 | Albert et al. | 439/144 |
| 4,638,405 | 1/1987 | Smith | 361/399 |
| 4,960,387 | 10/1990 | Davis et al. | 439/374 |
| 5,184,961 | 2/1993 | Ramirez et al. | 439/59 |

FOREIGN PATENT DOCUMENTS 4039995  2/1992  Japan .................. 361/413

*Primary Examiner*—Leo P. Picard
*Assistant Examiner*—Bot Ledynh
*Attorney, Agent, or Firm*—Lester H. Birnbaum

[57] ABSTRACT

Disclosed is an interconnection scheme which provides alignment when inserting or removing a circuit pack in a shelf. The circuit pack includes a pair of tabs which engage the connector housing on the backplane to prevent any significant rotation of the pack when inserting or removing the pack.

7 Claims, 4 Drawing Sheets

CIRCUIT PACK INTERCONNECTION

BACKGROUND OF THE INVENTION

This invention relates to circuit packs.

Circuit packs include a circuit board with components mounted thereon and an electrical connector or deposited gold fingers on one edge of the board. In a typical interconnection scheme, a plurality of pins is provided through a backplane mounted at the far end of a shelf. Each pack is inserted vertically or horizontally into the shelf (also known as a "subrack") on guideways so that the connector engages the appropriate pins for connection to that circuit pack when the pack is in its final position. The circuit pack is usually inserted into the backplane using a lever, sometimes referred to as a latch or injector-ejector.

One of the problems which can occur in using circuit packs which require mating of pins and sockets is the occurrence of bent pins which affects the reliability of the system. Bent pins can occur due to misalignment between the pins and the circuit pack connector. Shelf tolerances and circuit pack rotation are the primary contributors to this misalignment. In order to deal with the rotation problem, the prior art has suggested reducing the rotation of the circuit packs by means of a lever on the circuit pack faceplate (see U.S. Pat. No. 4,638,405) or by means of fulcrums mounted on the face of the connector (see U.S. Pat. No. 4,960,387).

SUMMARY OF THE INVENTION

The invention is a circuit pack including a printed circuit board having a forward edge, and a first electrical connector mounted on the edge and adapted for mating with a second electrical connector on a backplane. The circuit pack includes tabs extending beyond the first connector and spaced from said first connector to form gaps which accommodate portions of the second connector when the two connectors are mated. The extension of the tabs beyond the first connector and the gaps between the tabs and the first connector are such as to provide alignment and inhibit rotation of the circuit board when the two connectors are mated.

BRIEF DESCRIPTION OF THE DRAWING

These and other features of the invention are delineated in detail in the following description. In the drawing.

It will be appreciated that, for purposes of illustration, these figures are not necessarily drawn to scale.

DETAILED DESCRIPTION

Figure 1:
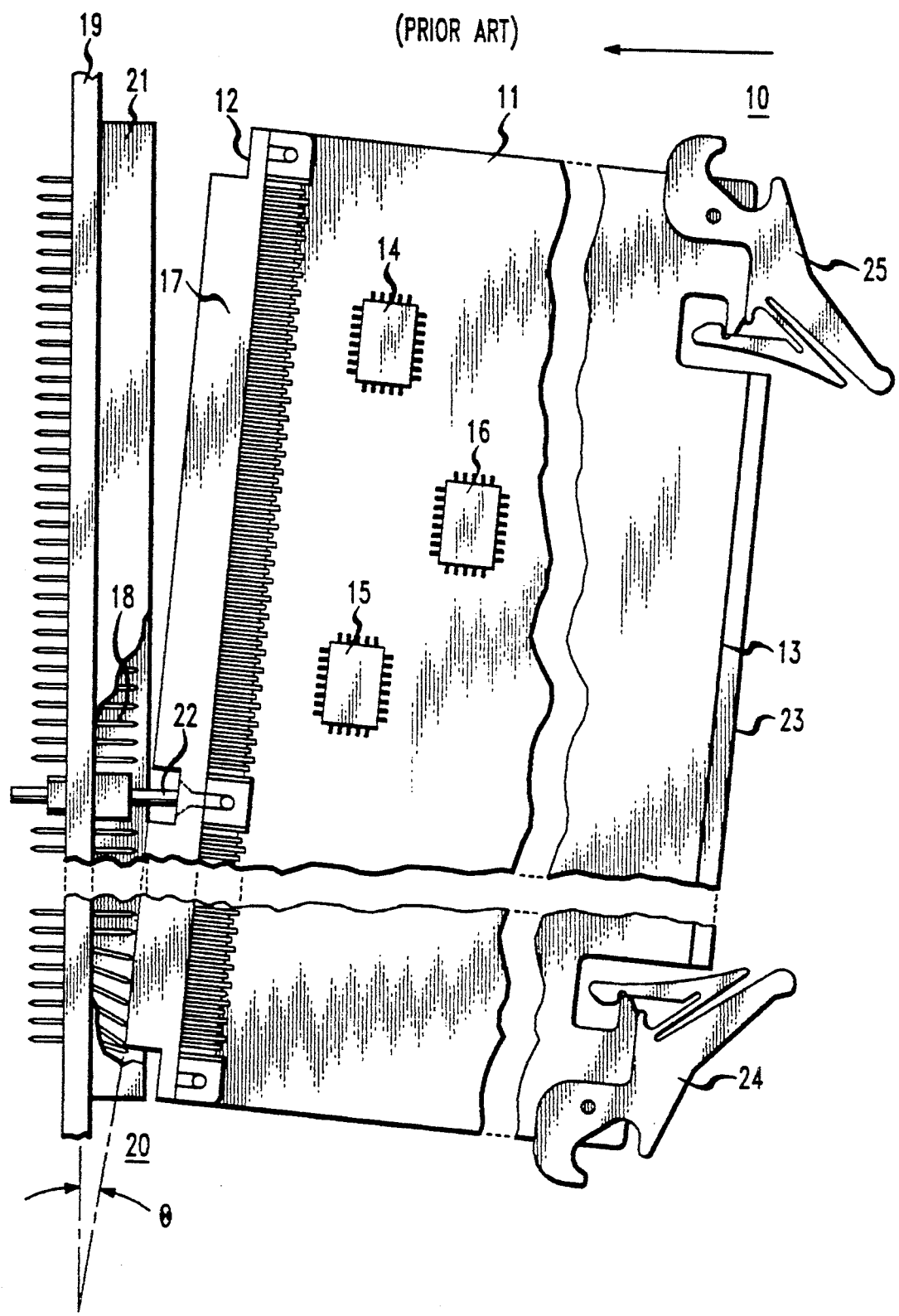
FIG. 1 is a side view of a portion of a circuit pack and backplane in accordance with a prior art configuration.
Figure 2:
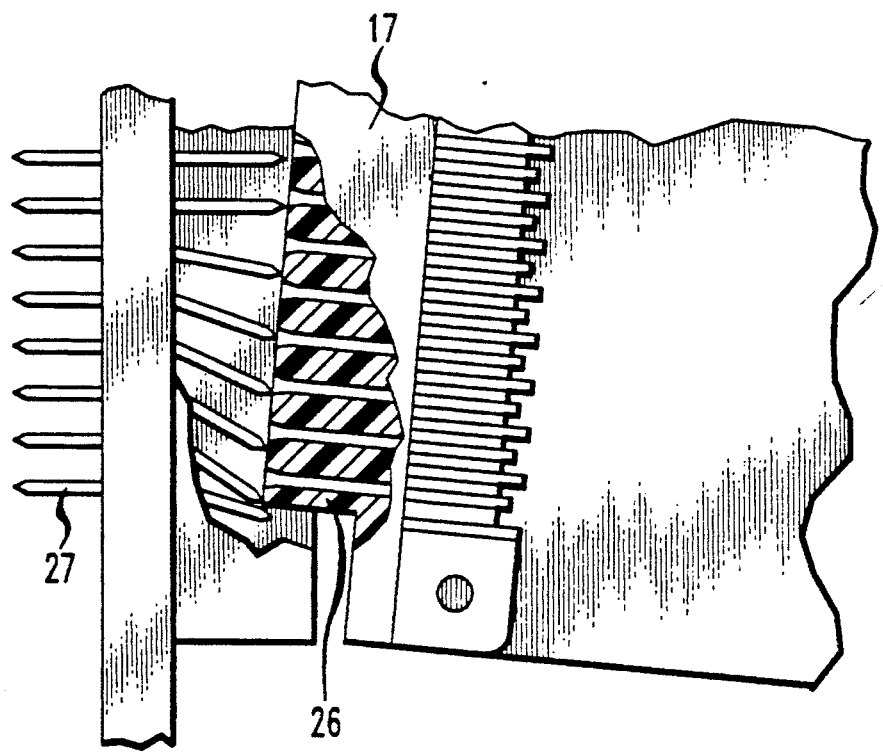
FIG. 2 is an enlargement of a portion of the circuit pack and backplane of FIG. 1.

FIGS. 1 and 2 illustrate portions of a prior art interconnection scheme. A circuit pack, 10, includes a printed circuit board, 11, with at least one major surface including a plurality of electronic components, only three of which are illustrated as semiconductor devices 14–16. The circuit board also has a forward edge, 12, and a rearward edge, 13. The forward edge includes an electrical connector, 17, which in this example is a socket-type connector for receiving and electrically engaging a plurality of pins, e.g., 18, mounted to a backplane, 19. The pins are mounted to the backplane by means of a standard backplane connector, 20, which is press-fitted or soldered to the backplane.

Figure 3:
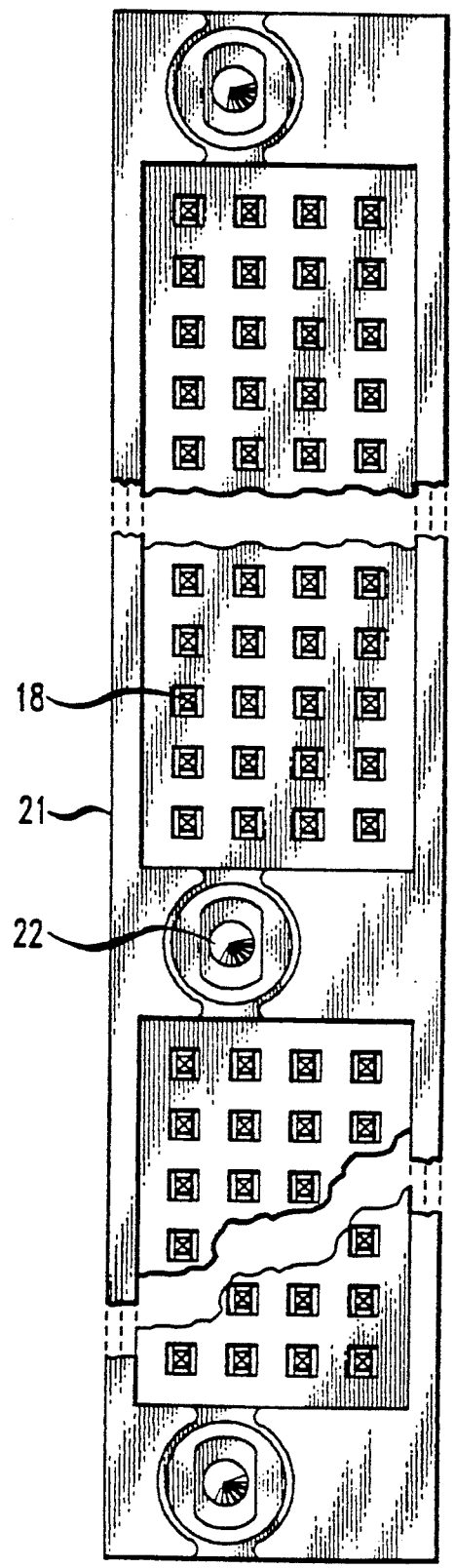
FIG. 3 is a front view of a backplane connector in accordance with the prior art.

The backplane connector is also shown in the front view of FIG. 3. It will be noted that a shroud, 21, surrounds the pins extending from the backplane and forms the aperture within which the connector (17 of FIG. 1) of the circuit pack will mate with the pins.

It will be noted that the connector, 20, on the backplane also typically includes a guide pin, 22, for inserting the circuit pack connector, 17, to thereby align the pins with their corresponding sockets.

The rearward edge of the circuit pack includes a faceplate, 23, containing information about the circuit pack, and a pair of latches, 24 and 25, mounted to the rearward edge and used to secure the circuit pack to the shelf (not shown) in which it is inserted.

Typically, a circuit pack such as illustrated in FIG. 1 is inserted vertically in a shelf which includes a plurality of guideways (not shown) for aligning the pack with the appropriate array of pins on the backplane (19). The circuit pack connector, 17, will engage the pins, assisted by the latches 24 and 25, thus providing electrical connection between the circuit pack and backplane, as the circuit pack approaches its final position in the shelf (the arrow indicates the direction of insertion). Once the pack is fully inserted, the latches, 24 and 25, will lock the circuit pack in place. (For an example of a typical shelf and latching arrangement, see, e.g., U.S. Pat. No. 4,991,062 issued to Nguyenngoc, which is incorporated by reference herein.)

In spite of the presence of the shelf and guideways, there is still considerable leeway for the circuit pack connector to be misaligned with the backplane connector while the pack is being inserted or removed from the shelf as illustrated in FIG. 1 and the enlarged portion of FIG. 2. If the pack rotates, causing vertical misalignment, while the connector is engaging the pins, the pins (e.g., 27) can be bent by striking the solid portions (e.g., 26) of connector 17. Thus, vertical misalignment can exceed the capture windows of the connector. In a typical example, the connector 17 will have a tolerance of ±0.51 mm to capture the pins. However, the typical shelf tolerance is ±1.78 mm.

Figure 4:
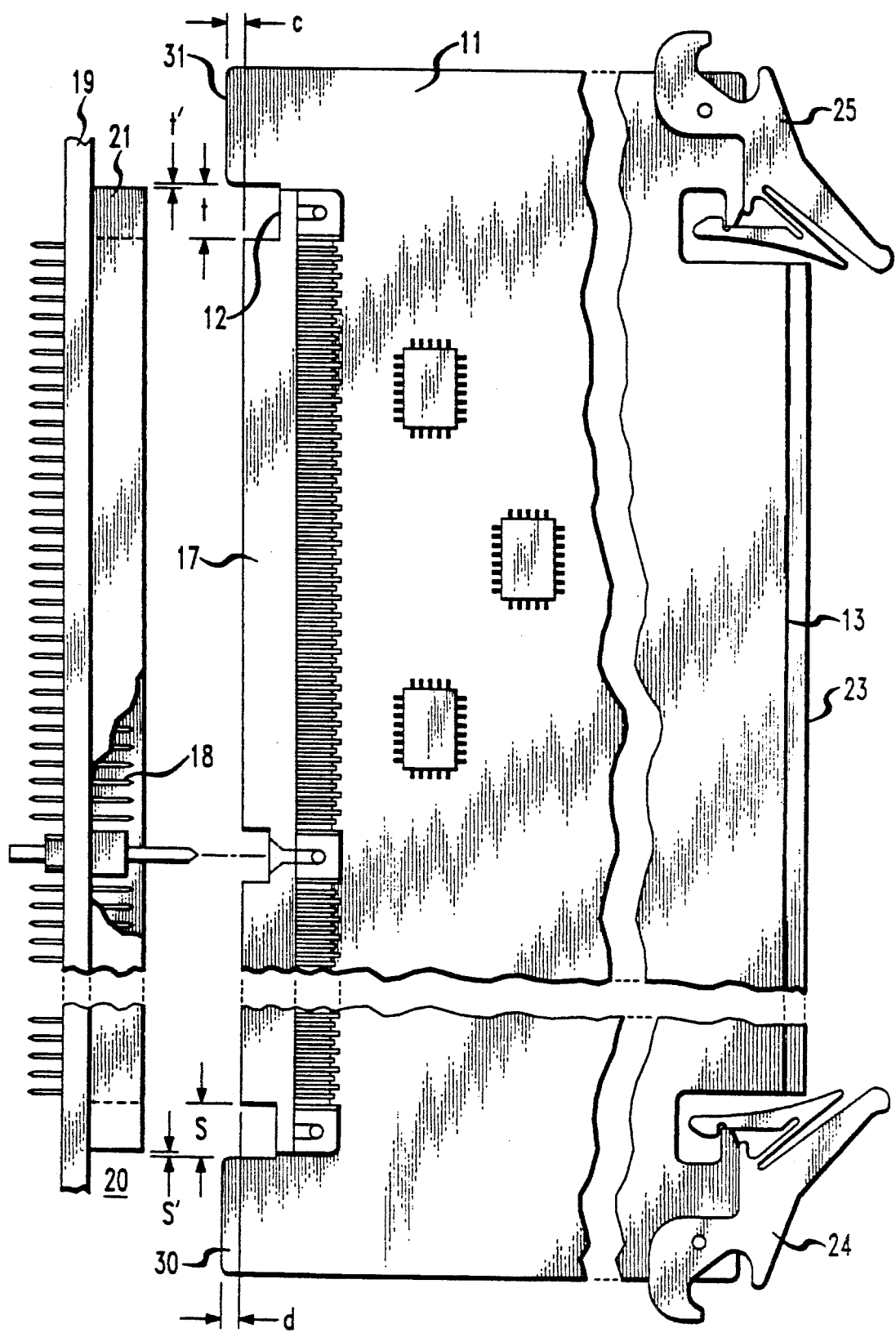
FIG. 4 is a side view of a portion of a circuit pack and backplane in accordance with an embodiment of the invention.

FIG. 4 illustrates an embodiment of the invention, where elements corresponding to those of FIGS. 1 and 2 are similarly numbered. In this embodiment, the forward edge, 12, of the printed circuit board, 11, includes tabs, 30 and 31, extending beyond the forward face of the connector, 17, at the top and bottom of the circuit board. The tabs are placed a distance s and t from the socket (pin receiving) portion of connector, 17, (where typically s=t) such that the shroud, 21, of the backplane connector will fit within the spaces between the connector, 17, and tabs from the position where the circuit pack connector, 17, just engages the pins, 18, of the backplane connector until the circuit pack is fully inserted. That is, when the circuit pack is inserted into the shelf, the tabs will first capture the shroud of the backplane connector and provide the needed gross vertical alignment so that the circuit pack connector, 17, is captured by the backplane connector, 20. When the circuit pack is further inserted, the tabs will fully align the pins and sockets to establish the electrical connection.

If, however, the circuit pack is misaligned by rotation or other causes, the tabs will stub against the shroud of the backplane to prevent further insertion and bending of the pins.

The tabs will also prevent rotation of the circuit pack when the connector, 17, disengages from the backplane connector, 20. It will be appreciated, for example, that, in a circuit pack having dual latches, (24 and 25) any attempt by a craftsperson to disengage using one of the latches results in one of the tabs locking up with the shroud of the backplane connector or at least causing a sufficient amount of resistance to warn the craftsperson to eject the circuit pack using both latches.

It is desirable to choose the dimensions s and t so that there is a clearance, s' and t', between the tabs 30, 31 and the connector shroud, 21, within the range 0.38 mm to 0.51 mm. It is also desirable to provide the dimensions c and d greater than 5.08 mm to provide proper alignment. While in this particular example, the tabs, 30 and 31, are extensions of the printed circuit board, 11, it will be appreciated that the tabs could comprise separate elements mounted to the board. Further, while the connector, 17, in the board is a socket, or female-type, connector, it could also be a bayonet, or male-type, connector with the backplane connector, 20, comprising a socket, or female-type, connector. In either case, the tabs will prevent significant rotation of the circuit pack to prevent bending of the pins when the backplane and circuit pack connectors are mechanically engaged.

Further, although the invention has been described primarily in terms of pin and socket connections, it could also be utilized where gold fingers are formed on the circuit pack. That is, the tabs could provide the proper alignment to ensure that the gold fingers are mated with the proper type in the connector backplane thereby eliminating wrong interconnections or shorting.

It will be appreciated, therefore, that the term "connector" used in the claims is intended to include conductive fingers deposited on the circuit pack which engages with a matching connector on the backplane.

Various additional modifications will become apparent to those skilled in the art. All such variations which basically rely on the teachings through which the invention has advanced the art are properly considered within the scope of the invention.

We claim:
1. A circuit pack comprising:
   a printed circuit board having a forward edge;
   a first electrical connector mounted on said forward edge and having a mating portion adapted for mating with a second electrical connector on a backplane; and
   at least one tab extending from the forward edge beyond the first connector and spaced from the mating portion of the first connector to form a gap which accommodates a portion of said second connector when the two connectors are mated, the extension of the tab beyond the first connector and the gap between the tab and the first connector being such as to provide alignment and to inhibit rotation of the circuit board when the two connectors are mated.

2. The device according to claim 1 wherein the tab is an integral portion of the circuit board extending beyond the first connector.

3. The device according to claim 1 wherein a tab is provided at a top and a bottom edge of the circuit board.

4. The device according to claim 1 wherein the first connector comprises a socket-type electrical connector adapted for engaging a plurality of pins extending from the second connector.

5. The device according to claim 1 wherein the circuit board further includes a rearward edge with a faceplate and latch mounted thereto.

6. The device according to claim 1 wherein the tabs extend beyond the first connector by a distance greater than 5.08 mm.

7. The device according to claim 1 wherein the tabs are spaced from the mating portion of the first connector by an amount so as to produce a spacing of the tabs from the mating portion of the second connector in the range 0.38 mm to 0.51 mm when the first connector is mated with the second connector.

* * * * *

UNITED STATES PATENT AND TRADEMARK OFFICE
CERTIFICATE OF CORRECTION

PATENT NO. : 5,317,480
DATED : May 31, 1994
INVENTORS : Vidyananda B. Chandraiah and David J. Pongracz It is certified that error appears in the above-identified patent and that said Letters Patent is hereby corrected as shown below:

Column 2, lines 13-14, Change "inserting the " to --inserting in the--.

Column 3, line 35, Change "type" to --tyne--.

Signed and Sealed this

Ninth Day of April, 1996

Attest:

BRUCE LEHMAN

*Attesting Officer*  Commissioner of Patents and Trademarks